United States Patent
Wang et al.

(10) Patent No.: US 7,200,821 B2
(45) Date of Patent: Apr. 3, 2007

(54) RECEIVER AND METHOD FOR MITIGATING TEMPORARY LOGIC TRANSITIONS

(75) Inventors: Lei Wang, Fort Collins, CO (US); Eric S. Fetzer, Longmont, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 390 days.

(21) Appl. No.: 11/089,576

(22) Filed: Jun. 7, 2004

(65) Prior Publication Data

US 2005/0270082 A1 Dec. 8, 2005

(51) Int. Cl.
 *G06F 17/50* (2006.01)
(52) U.S. Cl. .............................................. 716/1; 716/5
(58) Field of Classification Search .................... 716/1, 716/2, 5–6; 327/379, 382, 387, 389, 391, 327/392, 365
 See application file for complete search history.

(56) References Cited

U.S. PATENT DOCUMENTS

| | | | |
|---|---|---|---|
| 5,568,395 A | 10/1996 | Huang | |
| 5,900,766 A | 5/1999 | Naffziger et al. | |
| 6,201,420 B1 * | 3/2001 | Harvey | 327/109 |
| 6,480,987 B1 | 11/2002 | McBride | |
| 6,532,574 B1 | 3/2003 | Durham et al. | |
| 6,675,118 B2 | 1/2004 | Wanek et al. | |

OTHER PUBLICATIONS

M. Roca, E. Isern, F. Moll; "Line Geometry Implications On Crosstalk Noise Minimization"; 4 pages, no date.

* cited by examiner

*Primary Examiner*—Vuthe Siek

(57) ABSTRACT

A circuit and method for receiving data signals over a data signal line are disclosed. In one embodiment, a receiver circuit is provided for receiving data signals transmitted over a signal line. The receiver circuit comprises an inverter circuit having an input that forms an input of the receiver circuit and an output coupled to an internal node, an output circuit having an input coupled to the internal node and an output that provides an output of the receiver circuit, and a charge adding circuit that provides at least a portion of a temporary logic transition at the input of the receiver circuit, induced by a logic transition on an adjacent signal line, to the internal node to mitigate erroneous logic transitions associated with the receiver circuit.

20 Claims, 3 Drawing Sheets

RECEIVER AND METHOD FOR MITIGATING TEMPORARY LOGIC TRANSITIONS

BACKGROUND

On a VLSI integrated circuit, such as a microprocessor, some signal lines may be routed adjacent to each other over relatively large distances (e.g., over several hundred microns). This may be necessary because the signals have a common source and destination; are part of a large multi-bit bus, or were coincidentally routed adjacent to each other by an automated router. Unfortunately, this arrangement causes problems that may lead to unreliable, or incorrect, functioning of the integrated circuit.

When at least one of the signal lines switches (the culprit) while at least one of the other signals is attempting to remain at its previous value (the victim), the capacitance between the signal lines will cause the victim line to "glitch" as charge is capacitively transferred between the culprit line(s) and the victim line. This "glitch" can cause failures when, for example, it causes the victim line to rise above a gate threshold voltage from ground, turning on an n-channel FET (field effect transistor) whose gate is connected to the victim line.

For dynamic receiver circuits, in certain circumstances, the culprit and victim lines are pre-charged to a supply voltage. As the culprit line transitions to ground from the supply voltage, a voltage drop in the victim line can occur due to the coupling capacitance between the culprit line and the victim line. This can cause a change in logic of the dynamic receiver circuit associated with the victim line. As a result, the dynamic receiver circuit associated with the victim line erroneously discharges.

SUMMARY

One embodiment of the present invention may comprise a receiver circuit for receiving data signals transmitted over a signal line. The receiver circuit may comprise an inverter circuit having an input that forms an input of the receiver circuit and an output coupled to an internal node. The receiver circuit may further comprise an output circuit having an input coupled to the internal node and an output that provides an output of the receiver circuit. The receiver circuit may also comprise a charge adding circuit that provides at least a portion of a temporary logic transition at the input of the receiver circuit, induced by a logic transition on an adjacent signal line, to the internal node to mitigate erroneous logic transitions associated with the receiver circuit.

Another embodiment may comprise a data transmission system. The data transmission system may comprise a plurality of data signal lines, a plurality of dynamic receiver circuits having inputs coupled to respective data signal lines of the plurality of data signal lines, wherein each of the plurality of dynamic receiver circuits include a charge adding device that adds charge to an internal node of a respective dynamic receiver in response to temporary logic transitions on the input of the respective dynamic receiver caused by logic transitions of adjacent data signal lines.

Yet another embodiment of the present invention may relate to a dynamic receiver for receiving data signals transmitted over a signal line. The dynamic receiver may comprise means for receiving data signals from an input of the dynamic receiver, means for clocking the data signals to an output of the dynamic receiver, and means for reducing a temporary logic transition at the input of the dynamic receiver, due to a logic transition on an adjacent data signal line, to mitigate erroneous logic transitions at the output of the dynamic receiver.

Yet still another embodiment of the present invention may relate to a method for mitigating temporary logic transitions on an input of a dynamic receiver, that receives temporary logic transitions over a victim data signal line, caused by a logic transition on at least one culprit data signal line. The method may comprise transitioning a logic signal on the at least one culprit line, and adding charge to the receiver in response to a temporary logic transition on the victim data signal line caused by the logic signal transition on the at least one culprit data signal line to reduce the temporary logic transition.

DETAILED DESCRIPTION

This disclosure relates generally to a receiver circuit and methods for mitigating temporary logic transitions induced by logic transitions on adjacent signal lines. The receiver circuit receives data signals over a data signal line. The receiver circuit includes a charge adding circuit (e.g., a field effect transistor configured as a capacitor) that adds at least a portion of a temporary logic transition (e.g., a glitch) to an internal node of the receiver circuit to reduced the temporary logic transition and mitigate erroneous output logic transitions associated with the output of the receiver.

Figure 1:
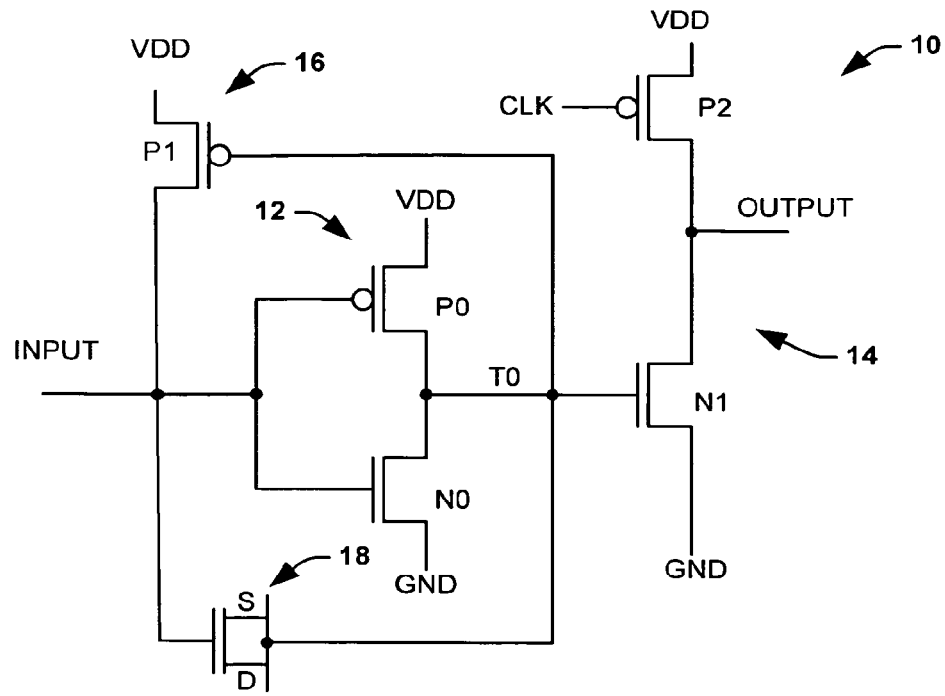
FIG. 1 illustrates an embodiment of a dynamic receiver.

FIG. 1 illustrates a dynamic receiver circuit 10. The dynamic receiver circuit 10 is operative to receive signals associated with a signal line associated with one or more other dynamic circuits (e.g., dynamic transmitter). A dynamic circuit is a circuit that is controlled by a clock signal in which logic signals propagate through the circuit on clock pulse transitions. The dynamic receiver circuit 10 includes an inverter 12 coupled to the input of the dynamic receiver circuit 10. The inverter 12 includes a p-type transistor P0 and an n-type transistor N0. The p-type transistor P0 has its source coupled to a supply voltage (VDD) and its drain coupled to a drain of the n-type transistor N0 through an internal node T0. The source of the n-type transistor N0 is coupled to ground. The internal node T0 is also coupled to a keeper circuit 16. The keeper circuit 16 is comprised of a p-type transistor P1 with its source coupled to the supply voltage VDD, and its drains coupled to the input of the dynamic receiver circuit 10.

The internal node T0 is also coupled to an output circuit 14. The output circuit 14 includes an n-type transistor N1 and a p-type transistor P2. The n-type transistor N1 is referred to as an evaluator device, while the p-type transistor P2 is referred to as a clocked PFET (p-type field effect transistor). The clocked PFET provides for the dynamic characteristics associated with the dynamic receiver such that an output of the dynamic receiver 10 is pre-charged to a supply voltage upon a negative clock transition to the gate of the clocked PFET P2, and output data may or not be floating at a supply voltage upon a positive clock signal transition to the gate of the clocked PFET P2. It is to be appreciated that the transistors P0, P1, N0, N1 and P2 can be field effect transistors (FETs).

The dynamic receiver 10 includes a charge adding device 18. The charge adding device 18 is coupled between the input of the dynamic receiver 10 and the internal node T0. The charge adding device 18 adds charge to the internal node T0 in response to a temporary logic transition, or signal glitch on the input invoked by a logic transition on a culprit line. For example, a temporary negative glitch on the input will cause a temporary positive glitch on T0. However, the charge adding device 18 will add at least a portion of the negative glitch from the input to the positive glitch on the node T0 to provide a resultant glitch at the node T0 that is substantially reduced. The charge adding device 18 can be a capacitor or a field effect transistor (FET) device configured as a capacitor. For example, in complimentary metal oxide semiconductor (CMOS) devices, integrated circuits capacitors are formed employing FET devices. In the present example, the charge adding device 18 is an n-type FET device with its drain and source coupled to one another and the internal node T0, and its gate coupled to the input of the dynamic receiver 10.

The resultant glitch at the node T0 can be reduced such that the evaluator transistor N1 does not change logic states based on the voltage change caused by the resultant glitch. The n-type FET charge adding device 18 can have a width and a length that are selected and optimized based on a function of the temporary glitch on the internal node T0 of the dynamic receiver 10 as a result of logic transition of one or more culprit lines. The temporary glitch on the node T0 of the dynamic receiver 10 as a result of logic transitions of one or more culprit lines is a function of the size of P0, N0, P1 and the length of the signal lines and the distance between the input of the receiver (victim line) and the one or more culprit lines. The dynamic characteristics associated with the dynamic receiver 10 make the dynamic receiver 10 more susceptible to temporary glitches than a static receiver. However, the charge adding device 18 can be employed in a static receiver to reduce noise and/or glitches associated with the static receiver.

Figure 2:
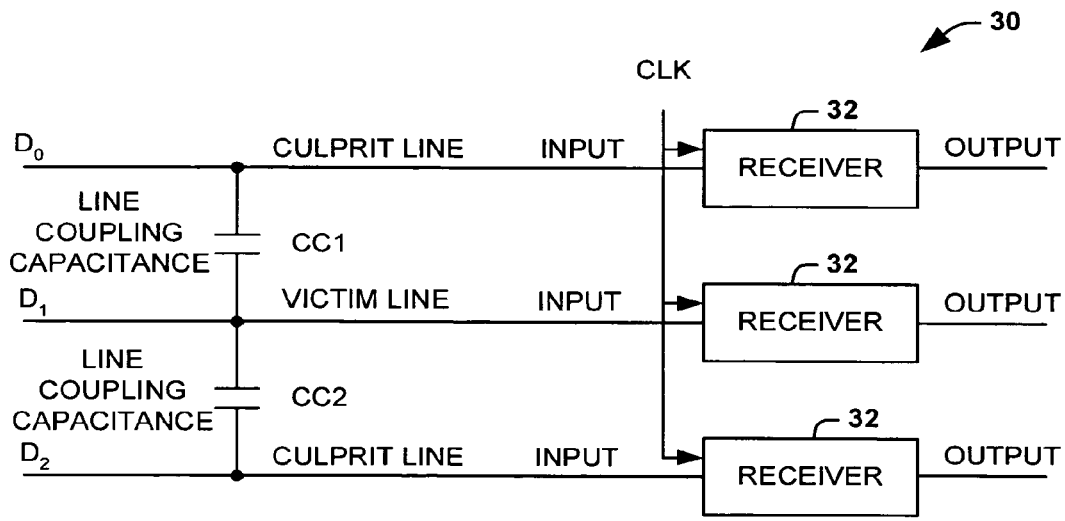
FIG. 2 illustrates an embodiment of a data transmission system.

FIG. 2 illustrates a data transmission system 30. The data transmission system 30 includes a plurality of data signal lines ($D_0$, $D_1$, $D_2$) coupled to a plurality of dynamic receiver devices 32. The data transmission system 30 can be part of an integrated circuit, and include additional dynamic circuits coupled to the inputs and outputs of the receivers. The plurality of data signal lines ($D_0$, $D_1$, $D_2$) can be part of a multi-bit bus, or a variety of different dynamic receiver configurations. The plurality of data signal lines ($D_0$, $D_1$, $D_2$) include a victim line $D_1$ and one or more culprit lines $D_0$ and $D_2$. The one or more culprit lines $D_0$ and $D_2$ can cause temporary logic transitions or glitches on the victim line $D_1$ as a result of logic transitions on the culprit lines due to coupling capacitance CC1 and CC2. The logic transitions on the culprit lines can induce temporary logic transitions or glitches on the input of the receivers 32 associated with the victim line. These temporary transitions or glitches on the input of the receivers 32 can cause logic transitions on the output of the receivers 32 that result in erroneous data being received by dynamic circuits downstream the dynamic receivers 32.

The dynamic receivers 32 clock data via a clock signal (CLK) to one or more downstream circuit devices. The dynamic receiver 32 associated with the victim line $D_1$ can include a charge adding devices that adds at least a portion of a glitch from the input to a glitch on an internal node of the dynamic receiver 32 to reduce or cancel the resultant glitch that is clocked to the output of the receiver 32. The charge adding device is selected to ensure that the resultant glitch is substantially reduced, such that erroneous data is not provided at the output of the receiver 32. The charge adding device can be a capacitor or a FET device configured as a capacitor.

It is to be appreciated that each of the plurality of receivers can include a charge adding device to mitigate temporary logic transitions or glitches caused by other data signal lines. For example, each signal can be a victim line and a culprit line, such that data transitions on any signal line can induce temporary logic transitions or glitches on another adjacent signal line.

Figure 3:
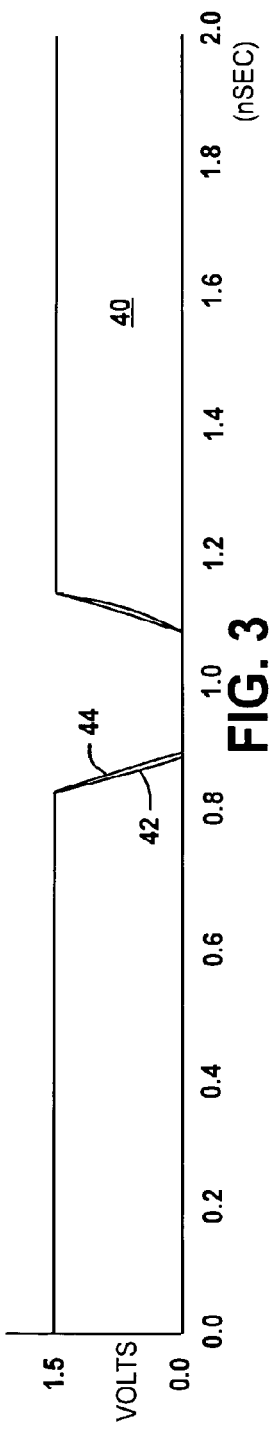
FIG. 3 is a graph of voltage versus time (nanoseconds) that illustrates a logic transition of a culprit line.

FIG. 3 is a graph 40 of voltage versus time (nanoseconds) that illustrates a logic transition of a culprit line. The culprit line transitions from a logic high (1.5 volts) to a logic low (0 volts) for about 0.1 nanoseconds in duration. The graph 40 illustrates a first line signal 42 for a dynamic receiver circuit without a charge adding device and a second line signal 44 for a dynamic receiver circuit with a charge adding device. As illustrated in FIG. 3, the employment of a charge adding device on a receiver for one or both the culprit line and victim line does not substantially effect the logic transitions of the culprit line.

Figure 4:
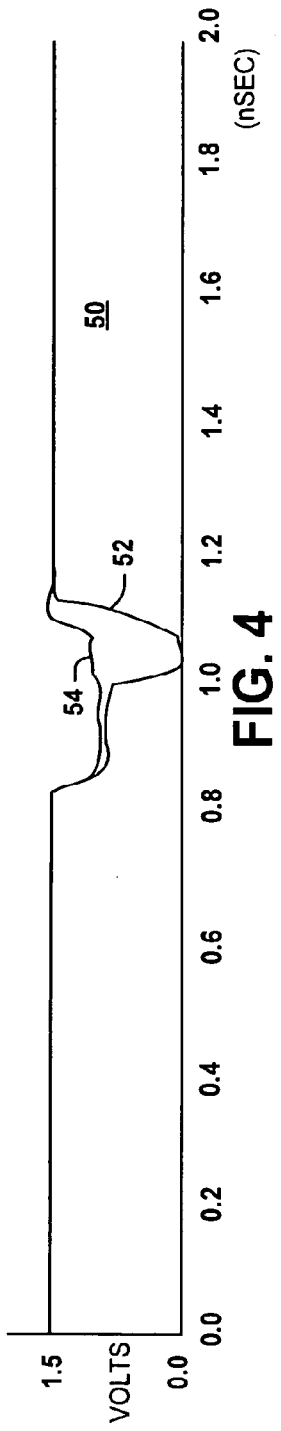
FIG. 4 is a graph of voltage versus time (nanoseconds) that illustrates a temporary logic transition of a victim line caused by the logic transition of the culprit line illustrated in FIG. 3.

FIG. 4 is a graph 50 of voltage versus time (nanoseconds) that illustrates a temporary logic transition of a victim line caused by the logic transition of the culprit line illustrated in FIG. 3. The graph 50 illustrates a first temporary logic transition 52 at an input of a dynamic receiver circuit without a charge adding device and a second logic transition 54 for a dynamic receiver circuit with a charge adding device. As illustrated in the graph 50, the first temporary logic transition 52 drops from about 1.5 volts to about 1.0 volts for about 0.2 nanoseconds and then drops from about 1.0 volts to about 0.0 volts for about 0.1 nanoseconds. The second temporary logic transitions 54 drops from about 1.5 volts to about 1.0 volts for about 0.3 nanoseconds but then returns to about 1.5 volts without dropping to 0.0 volts.

Figure 5:
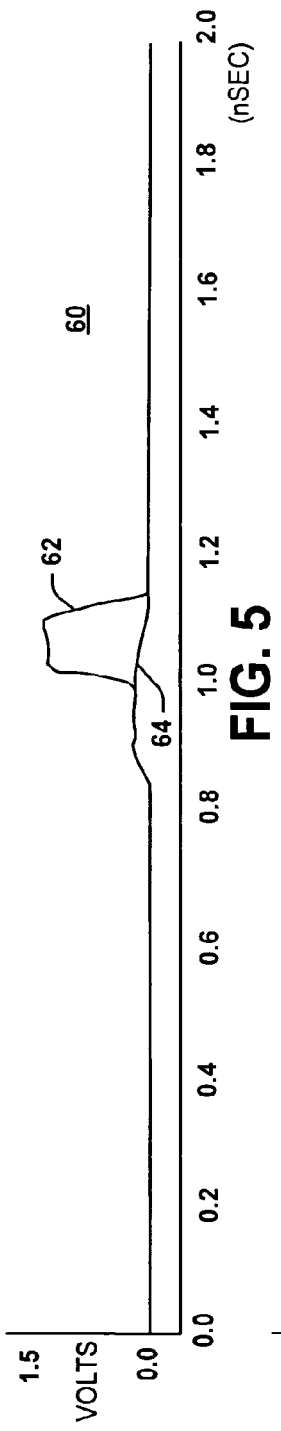
FIG. 5 is a graph of voltage versus time (nanoseconds) that illustrates a temporary logic transition of an internal node of a dynamic receiver associated with the victim line illustrated in FIG. 4.

FIG. 5 is a graph 60 of voltage versus time (nanoseconds) that illustrates a temporary logic transition of an internal node T0 of a dynamic receiver associated with the victim line illustrated in FIG. 4. The graph 60 illustrates a first temporary logic transition 62 at an internal node of the dynamic receiver circuit without a charge adding device and a second temporary logic transition 64 for an internal node of the dynamic receiver circuit with a charge adding device. As illustrated in the graph, the first temporary logic transition 62 rises from about 0.0 volts to about 0.25 volts for about 0.2 nanoseconds and then rises from about 0.25 volts to about 1.5 volts for about 0.1 nanoseconds. The second temporary logic transition 64 rises from about 0.0 volts to about 0.25 volts for about 0.3 nanoseconds but then returns to about 0.0 volts without rising to 1.5 volts.

As illustrated in the graphs of FIGS. 4–5, the charge adding device mitigates the amplitude of the temporary logic transitions on both the input and the internal node of the dynamic receiver circuit associated with the victim line. As a result, the output of the dynamic receiver circuit associated with the victim line is not affected by the logic transition associated with the culprit line due to the functionality of the charge adding device.

Figure 6:
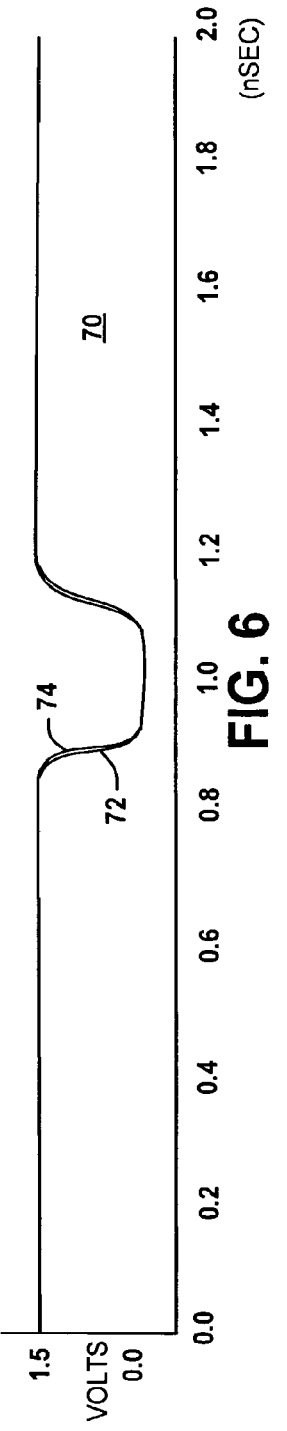
FIG. 6 is a graph of voltage versus time (nanoseconds) that illustrates a logic transition of an output of a dynamic receiver associated with the culprit line illustrated in FIG. 3.

FIG. 6 is a graph 70 of voltage versus time (nanoseconds) that illustrates a logic transition of an output of a dynamic receiver associated with the culprit line illustrated in FIG. 3. The output of the dynamic receiver associated with the culprit line transitions from a logic high (1.5 volts) to a logic low (0 volts) for about 0.1 nanoseconds in duration. The graph 70 illustrates a first output signal 72 for a dynamic receiver circuit without a charge adding device and a second output signal 74 for a dynamic receiver circuit with a charge adding device. As illustrated, the employment of a charge adding device on a receiver for one or both the culprit line and victim line does not substantially effect the logic transition speed of the culprit line.

Figure 7:
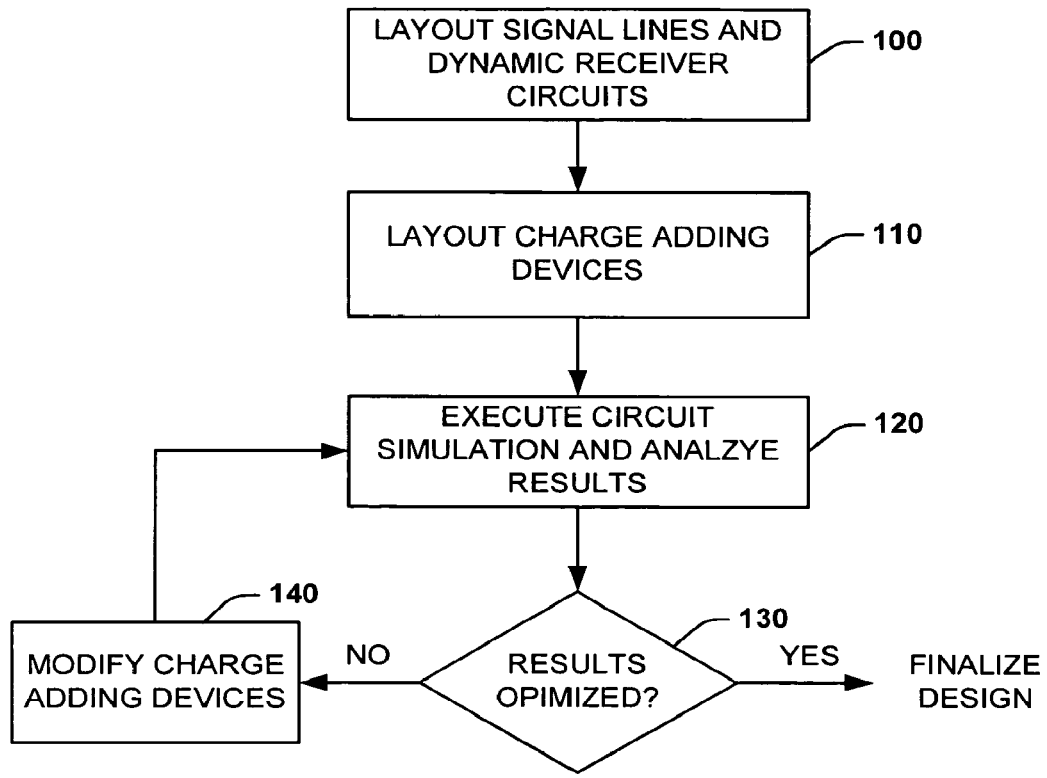
FIG. 7 illustrates an embodiment of a methodology for providing a data transmission system.
Figure 8:
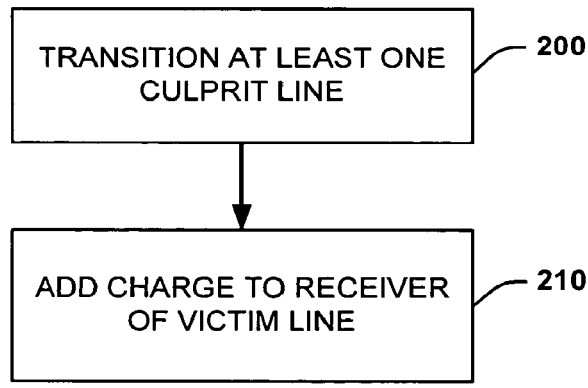
FIG. 8 illustrates a methodology for mitigating temporary logic transitions at an input of a dynamic receiver.

In view of the foregoing structural and functional features described above, certain methods will be better appreciated with reference to FIGS. 7–8. It is to be understood and appreciated that the illustrated actions, in other embodiments, may occur in different orders and/or concurrently with other actions. Moreover, not all illustrated features may be required to implement a method. It is to be further understood that the following methodologies can be implemented in hardware (e.g., a computer or a computer network as one or more integrated circuits or circuit boards containing one or more microprocessors), software (e.g., as executable instructions running on one or more processors of a computer system), or any combination thereof.

FIG. 7 illustrates a methodology for providing a data transmission system. The methodology begins at 100 by laying out signal lines and dynamic receiver circuits. At 110, charge adding devices are laid out in the dynamic receiver circuits such that a respective charge adding device is coupled to an input of the dynamic receiver circuit and an internal node. The charge adding device can be a capacitor or a field effect transistor configured as a capacitor. The methodology then proceeds to 120.

At 120, circuit simulations are executed and the results of the circuit simulations are analyzed. For example, logic on one or more culprit lines are transitioned, and the results of the induced temporary logic transitions caused by the culprit line transitions on the victim lines and the internal nodes and output of the dynamic receiver associated with the victim line is analyzed. The methodology then proceeds to 130 to determine if the results are optimized. If the results are optimized (YES), the design associated with the data transmission system is finalized. If the results are not optimized (NO), the methodology proceeds to 140. At 140, characteristics associated with one or more charge adding devices are modified. For example, if a FET is being employed as a charge adding device, the width and length of the FET can be modified to change characteristics associated with the FET operation. The methodology then returns to 120 to repeat the execution of the circuit simulation and the analysis of the circuit simulation results.

FIG. 8 illustrates a methodology for mitigating temporary logic transitions at an input of a dynamic receiver. The dynamic receiver can receive temporary logic transitions over a victim data signal line caused by a logic transition on at least one culprit data signal line. At 200, logic signals transition on the at least one culprit data signal line. At 210, charge is added to the receiver in response to a temporary logic transition on the victim data signal line caused by the logic signal transition on the at least one culprit data signal line to reduce the temporary logic transition.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A receiver circuit for receiving data signals transmitted over a signal line, the receiver circuit comprising:
   an inverter circuit having an input that forms an input of the receiver circuit and an output couped to an internal node;
   an output circuit having an input coupled to the internal node and an output that provides an output of the receiver circuit;
   a charge adding circuit that provides at least a portion of a temporary logic transition at the input of the receiver circuit, induced by a logic transition on an adjacent signal line, to the internal node to mitigate erroneous logic transitions associated with the receiver circuit.

2. The receiver circuit of claim 1, wherein the charge adding circuit is a capacitive device.

3. The receiver circuit of claim 1, wherein the charge adding circuit is a field effect transistor configured as a capacitor.

4. The receiver circuit of claim 3, wherein at least one of the width and length of the field effect transistor is optimized as a function of the size of the temporary logic transition.

5. The receiver circuit of claim 1, wherein the charge adding circuit provides at least a portion of a temporary logic transition at the input of the receiver circuit to an invented portion of the temporary logic transition at the internal node, such that an erroneous logic transition at the output of the receiver circuit is prevented.

6. The receiver circuit of claim 1, wherein the receiver circuit is a dynamic receiver and the output circuit includes an evaluator device and a clocking device that provides valid data associated with the evaluator device on a clock transition.

7. A data transmission system comprising:
   a plurality of data signal lines;
   a plurality of dynamic receiver circuits having inputs coupled to respective data signal lines of the plurality of data signal lines; and
   wherein each of the plurality of dynamic receiver circuits includes a charge adding device that adds charge to an internal node of a respective dynamic receiver in response to temporary logic transitions on the input of the respective dynamic receiver caused by logic transitions of adjacent data signal lines.

8. The system of claim 7, wherein at least one of the charge adding devices is capacitive device.

9. The system of claim 7, wherein at least one dynamic receiver circuit comprises:
   an inverter circuit having an input that forms an input of the dynamic receiver circuit and an output coupled to an internal node;

an output circuit having an input coupled to the internal node and an output that provides an output of the receiver circuit; and a charge adding circuit that provides at least a portion of a temporary logic transition at the input of the receiver circuit to the internal node of the receiver circuit.

10. The system of claim 9, wherein charge adding circuit is a capacitive device.

11. The system of claim 9, wherein the charge adding circuit is a field effect transistor configured as a capacitor.

12. The system of claim 11, wherein at least one of the width and length of the field effect transistor is optimized as a function of the size of the temporary logic transition.

13. The system of claim 9, wherein the plurality of data signal lines form a data bus.

14. A dynamic receiver for receiving data signals transmitted over a signal line, the dynamic receiver comprising:
means for receiving data signals from an input of the dynamic receiver;
means for clocking the data signals to an output of the dynamic receiver; and
means for adding charge to an internal node of the dynamic receiver to reduce a temporary logic transition on the internal node caused by a logic transition at the input of the dynamic receiver invoked by a logic transition on an adjacent data signal line.

15. The dynamic receiver of claim 14, wherein the means for adding charge to an internal node comprises means for adding at least a portion of the temporary logic transition at an input of the dynamic receiver to an inverted version of the temporary logic transition at the internal node to provide a reduced temporary logic transition at the internal node to mitigate erroneous logic transitions at an output of the dynamic receiver.

16. A method for mitigating temporary logic transitions on an input of a dynamic receiver, that receives temporary logic transitions over a victim data signal line, caused by a logic transition on at least one culprit data signal line, the method comprising:
transitioning a logic signal on at least one culprit data signal line; and
adding charge to the receiver in response to a temporary logic transition on the victim data signal line caused by the logic signal transition on the at least one culprit data signal line to reduce the temporary logic transition.

17. The method of claim 16, wherein the adding charge comprises adding at least a portion of a temporary logic transition to an inverted portion of the temporary logic transition at an internal node of the receiver, such that an erroneous logic transition at the output of the receiver is prevented.

18. The method of claim 17, wherein the adding charge comprises optimizing the amount of charge added to the internal node as a function of the temporary logic transition.

19. The method of claim 17, wherein the adding at least a portion of a temporary logic transition to an inverted portion of the temporary logic transition at an internal node of the receiver is preformed by coupling a field effect transistor configured as a capacitor to the internal node and the input of the receiver.

20. The method of claim 19, wherein the adding charge is optimized by selecting at least one of a width and a length of the field effect transistor as a function of the size of the temporary logic transition.

* * * * *

UNITED STATES PATENT AND TRADEMARK OFFICE
CERTIFICATE OF CORRECTION

PATENT NO.        : 7,200,821 B2                                              Page 1 of 1
APPLICATION NO.   : 11/089576
DATED             : April 3, 2007
INVENTOR(S)       : Lei Wang et al.

It is certified that error appears in the above-identified patent and that said Letters Patent is hereby corrected as shown below:

In column 6, line 21, in Claim 1, delete "couped" and insert -- coupled --, therefor.

In column 6, line 41, in Claim 5, delete "invented" and insert -- inverted --, therefor.

In column 8, line 26, in Claim 19, delete "preformed" and insert -- performed --, therefor.

Signed and Sealed this

Second Day of September, 2008

JON W. DUDAS
*Director of the United States Patent and Trademark Office*

UNITED STATES PATENT AND TRADEMARK OFFICE
CERTIFICATE OF CORRECTION

PATENT NO.       : 7,200,821 B2                                                Page 1 of 1
APPLICATION NO.  : 11/089576
DATED            : April 3, 2007
INVENTOR(S)      : Lei Wang et al.

It is certified that error appears in the above-identified patent and that said Letters Patent is hereby corrected as shown below:

In the Claims

Claim 5, Column 6, Line 40, is to be amended by deleting the word "a" and adding the word the. Claim 5 should read as follows:

5. The receiver circuit of claim 1, wherein the charge adding circuit provides at least a portion of the temporary logic transition at the input of the receiver circuit to an inverted portion of the temporary logic transition at the internal node, such that an erroneous logic transition at the output of the receiver circuit is prevented.

Signed and Sealed this
Twenty-fourth Day of May, 2016

Michelle K. Lee
*Director of the United States Patent and Trademark Office*